(12) United States Patent
Nakanishi

(10) Patent No.: US 7,230,593 B2
(45) Date of Patent: Jun. 12, 2007

(54) ELECTRO-OPTICAL DEVICE, WIRING SUBSTRATE, AND ELECTRONIC APPARATUS

(75) Inventor: Hayato Nakanishi, Toyama (JP)

(73) Assignee: Seiko Epson Corporation, Tokyo (JP)

( * ) Notice: Subject to any disclaimer, the term of this patent is extended or adjusted under 35 U.S.C. 154(b) by 418 days.

(21) Appl. No.: 10/615,849

(22) Filed: Jul. 10, 2003

(65) Prior Publication Data

US 2004/0041753 A1    Mar. 4, 2004

(30) Foreign Application Priority Data

Jul. 18, 2002   (JP) .............................. 2002-209880
Jul. 8, 2003    (JP) .............................. 2003-193671

(51) Int. Cl.
G09G 3/30      (2006.01)
G09G 3/10      (2006.01)
G01J 1/62      (2006.01)

(52) U.S. Cl. ........................... 345/80; 345/36; 345/87; 313/500; 313/505; 315/169.3; 257/207

(58) Field of Classification Search ................ 345/76, 345/82–83, 36, 55, 80, 92, 211, 214; 313/506, 313/500, 504, 505; 315/169.3; 257/81, 257/99, 207
See application file for complete search history.

(56) References Cited

U.S. PATENT DOCUMENTS 5,923,119 A  *  7/1999  Hara et al. .................. 313/506
6,359,606 B1     3/2002  Yudasaka
6,522,315 B2     2/2003  Ozawa et al.
6,690,110 B1  *  2/2004  Yamada et al. ............. 313/506
6,788,278 B2  *  9/2004  Aoki ............................ 345/82
6,825,820 B2  *  11/2004 Yamazaki et al. ............ 345/76
2002/0197392 A1 * 12/2002 Endo et al. .................... 427/66

FOREIGN PATENT DOCUMENTS

| JP | A-2001-102169 | 4/2001 |
| JP | A 2002-110343 | 4/2002 |
| JP | A 2002-151276 | 5/2002 |
| KR | 2000-0068846 A | 11/2000 |
| KR | 2002-0057247 A | 7/2002 |
| WO | WO98/36407 | 8/1998 |
| WO | WO 99/12394 | 3/1999 |

* cited by examiner

Primary Examiner—Henry N. Tran
(74) Attorney, Agent, or Firm—Oliff & Berridge, PLC

(57) ABSTRACT

The invention provides an electro-optical device in which a voltage drop due to the wiring resistance of a cathode is reduced and therefore steady image signals are transmitted such that erroneous image display, such as low contrast, is reduced or prevented. The invention also provides an electronic apparatus including such an electro-optical device. An electro-optical device includes red, green, and blue luminescent power-supply lines to apply currents to light-emitting elements arranged in an actual display region in a matrix; and a cathode line disposed between the light-emitting elements and a cathode. The cathode line has a width larger than a width of red, green, and blue luminescent power-supply lines.

20 Claims, 11 Drawing Sheets

[Fig. 1]
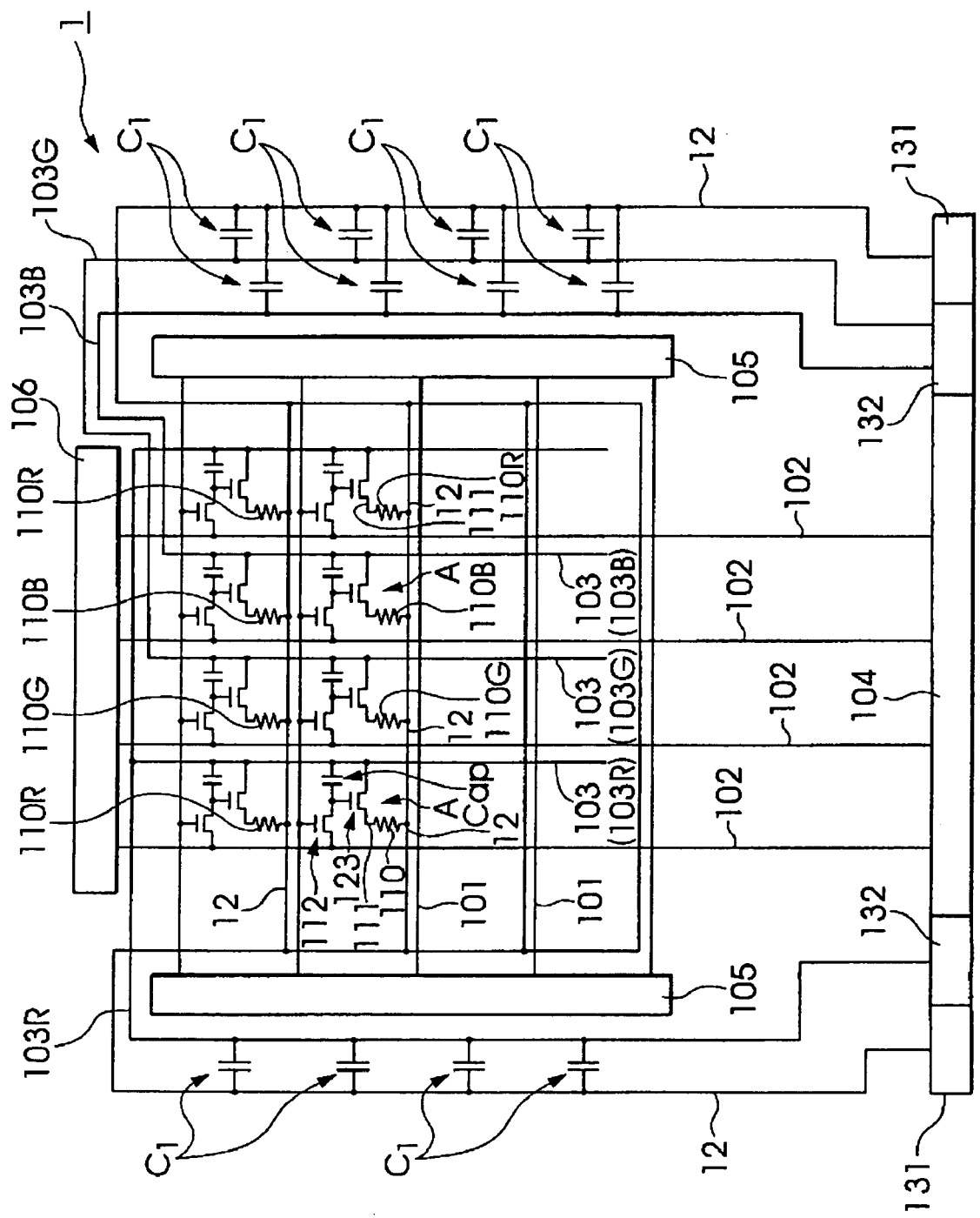

[Fig. 2]
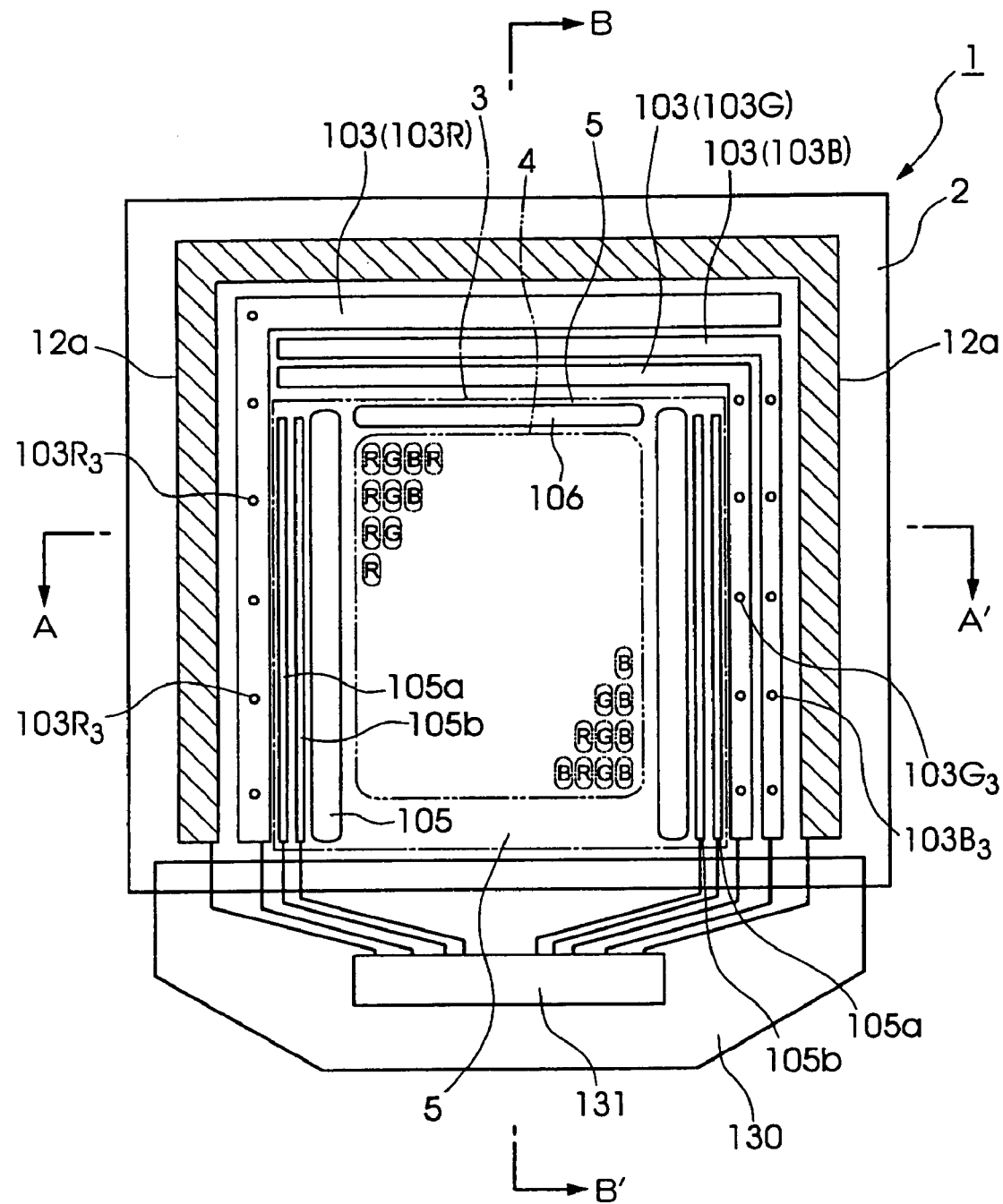

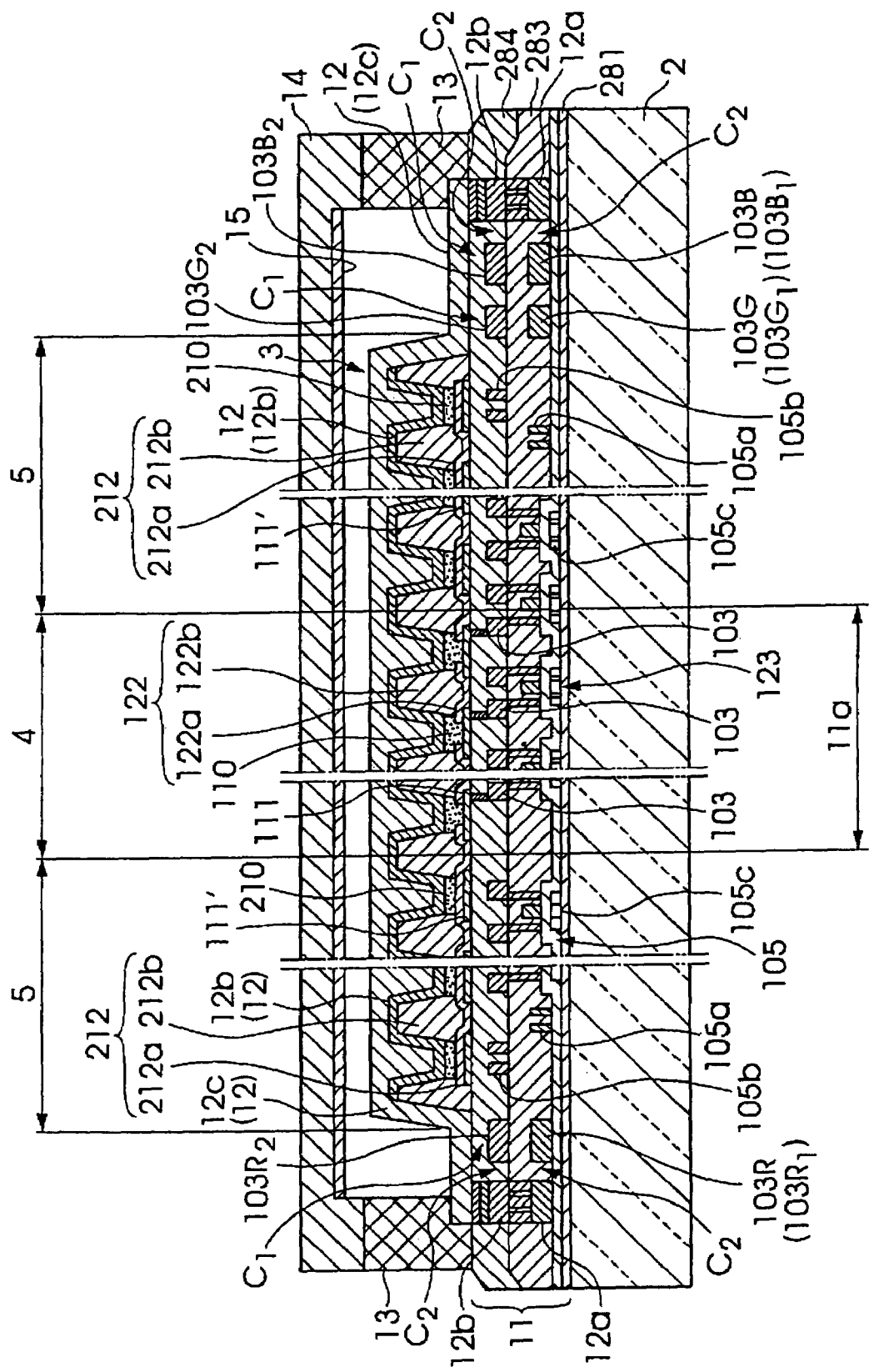
[Fig. 3]

[Fig. 4]
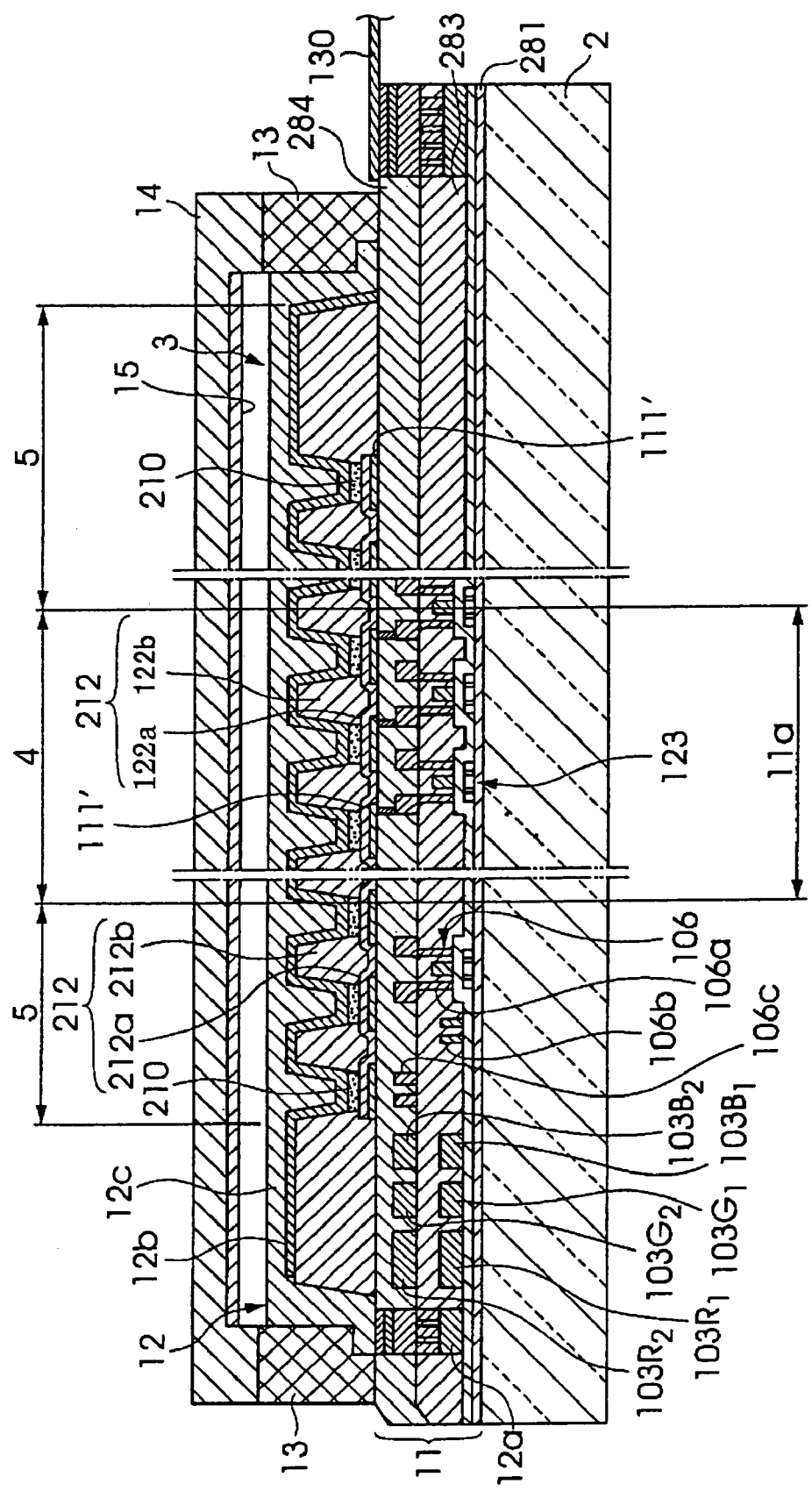

[Fig. 5]
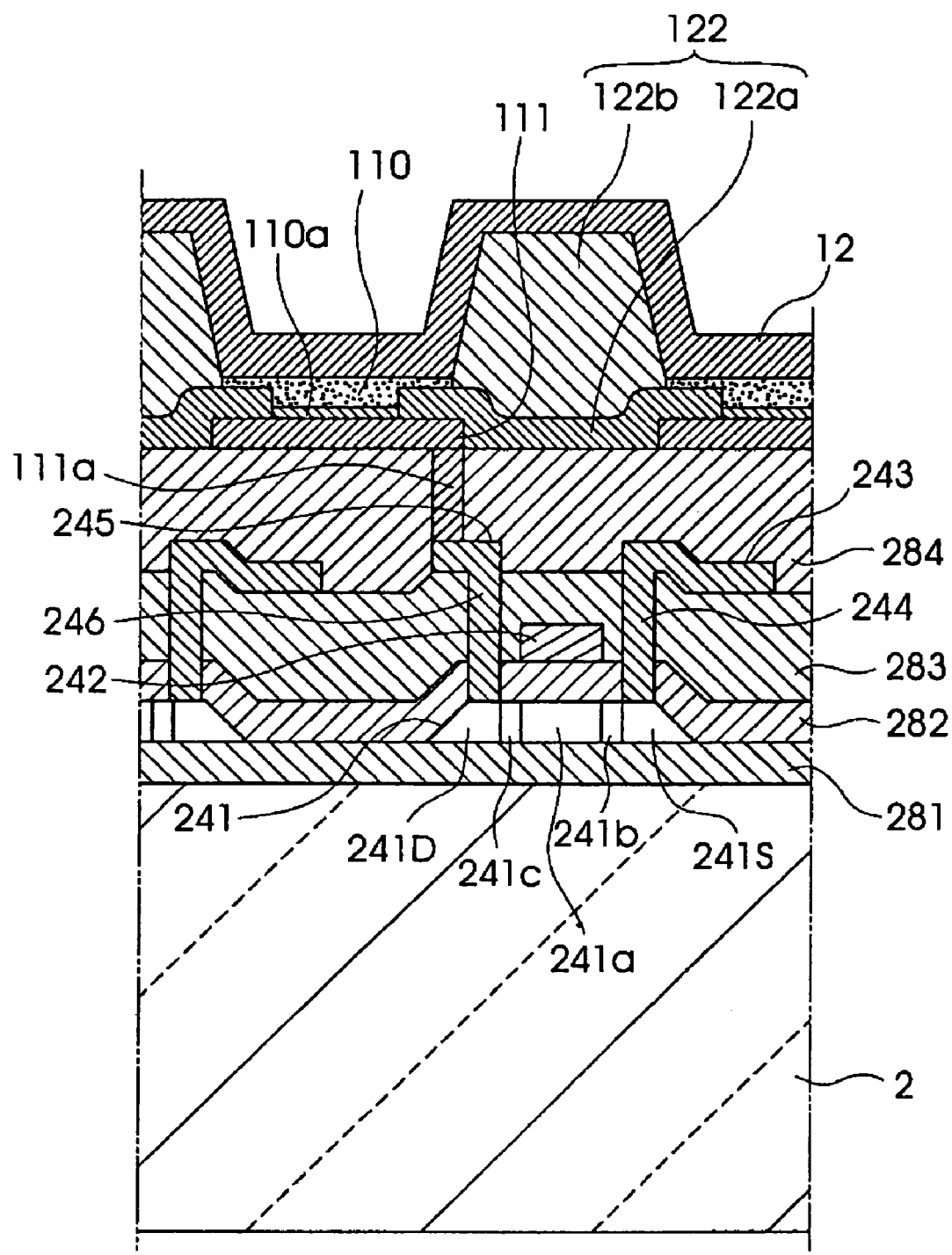

[Fig. 6]
(a)
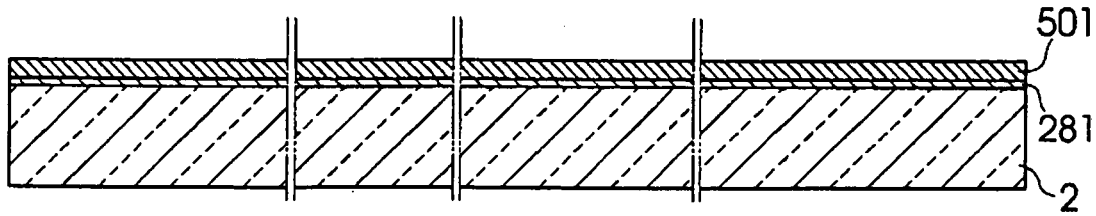
(b)
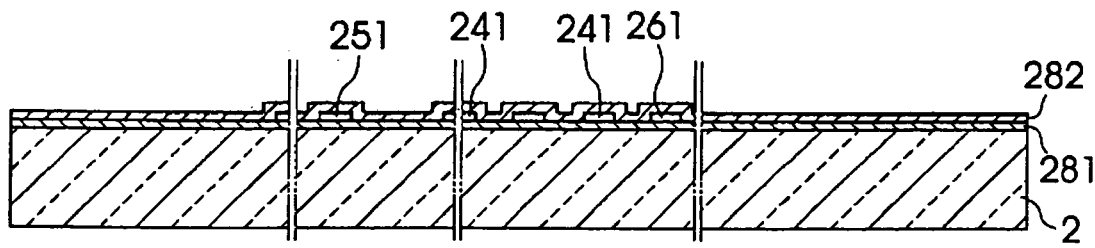
(c)
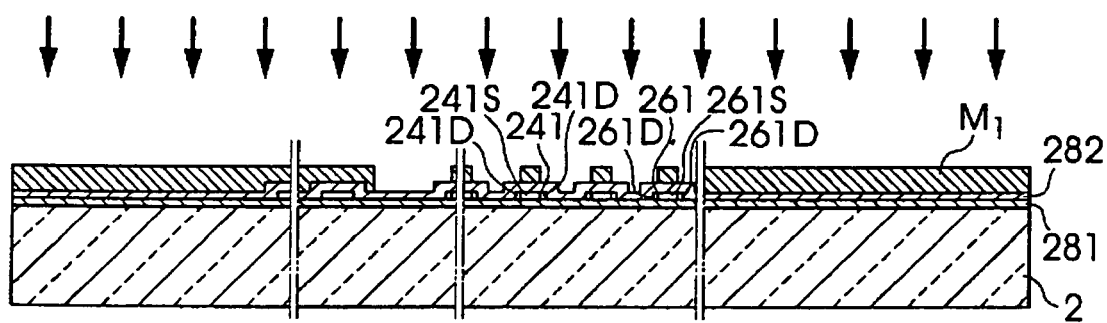
(d)
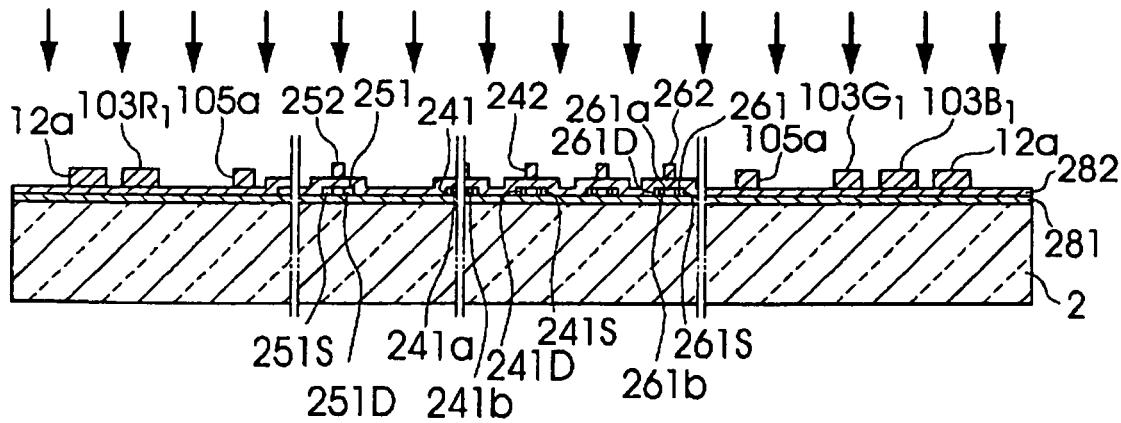

[Fig. 7]
(a)
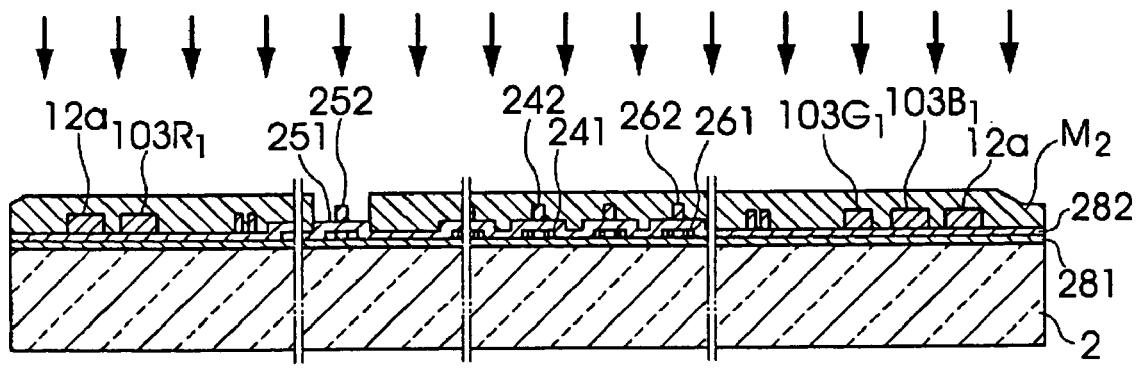
(b)
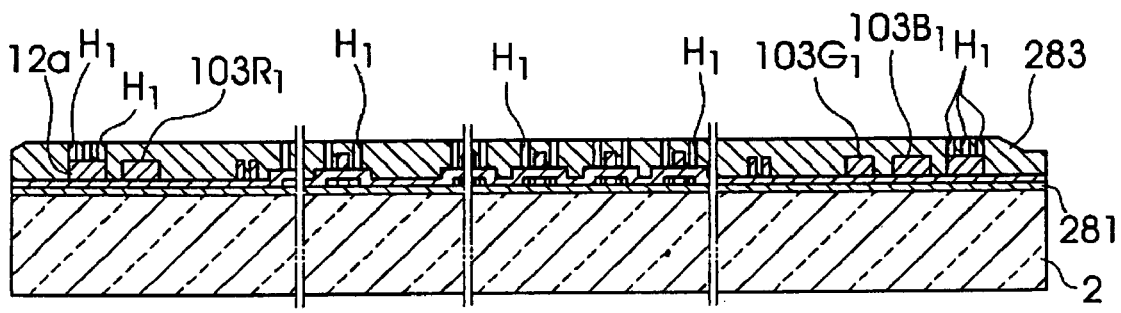
(c)
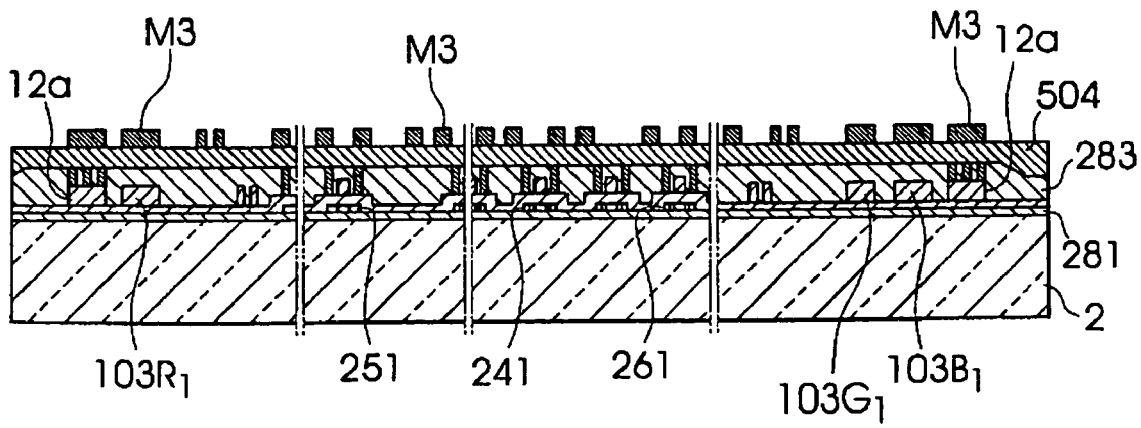

[Fig. 8]
(a)
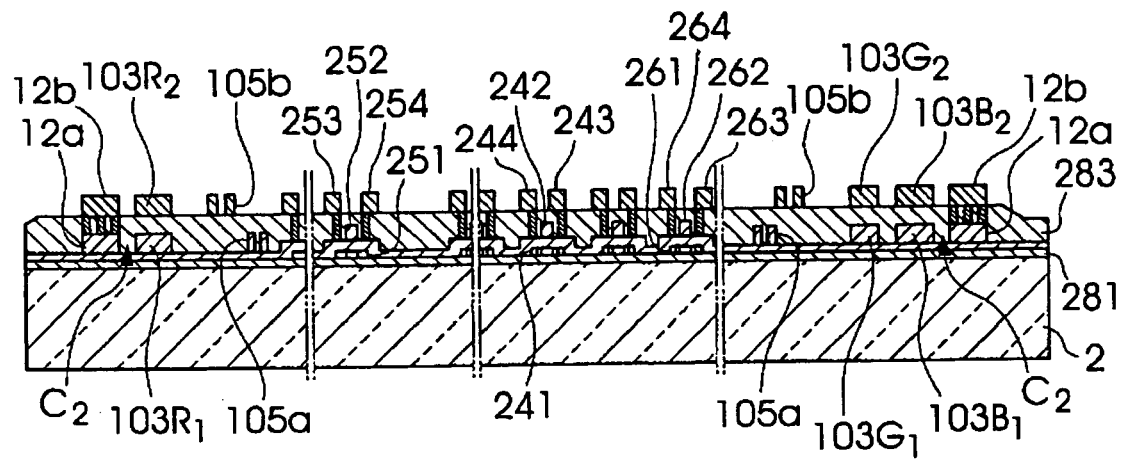
(b)
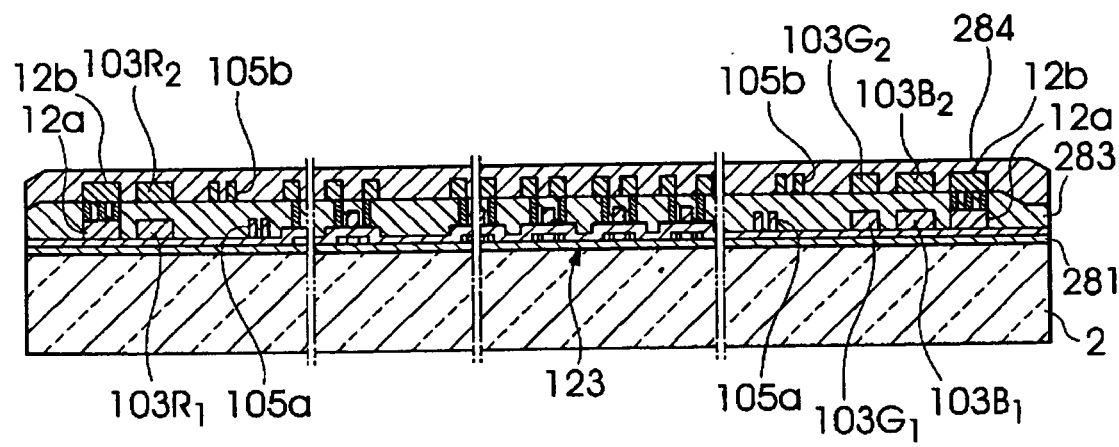
(c)
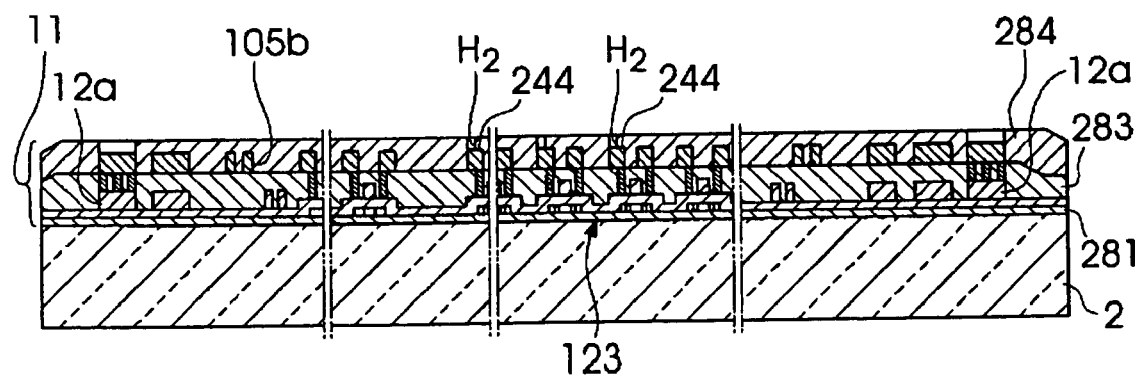

[Fig. 9]
(a)
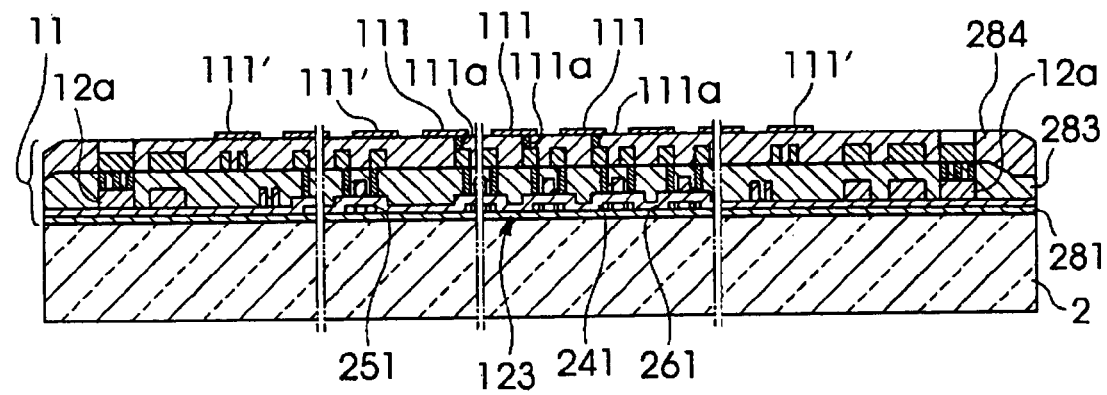
(b)
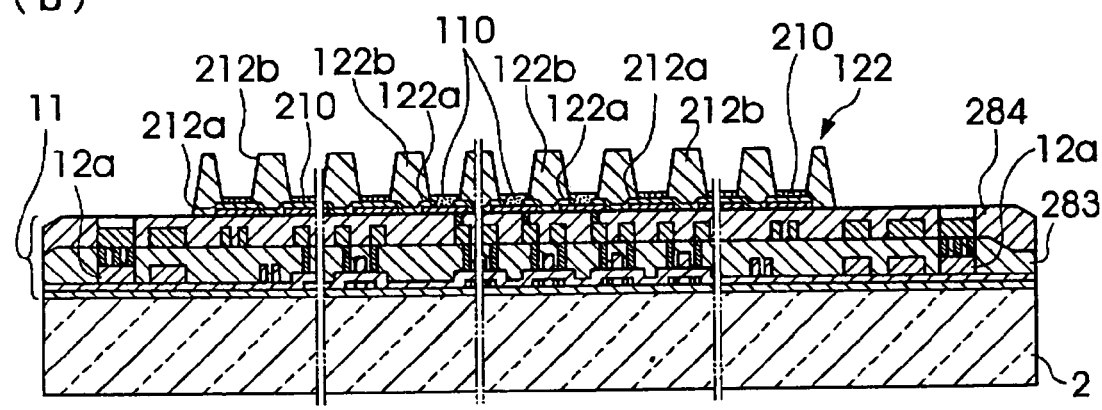
(c)
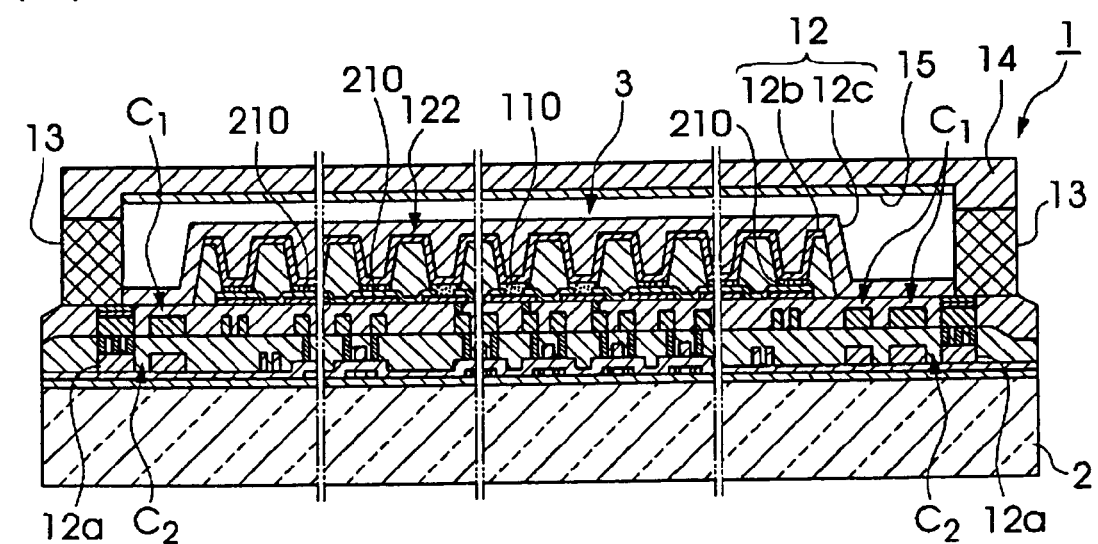

[Fig. 10]
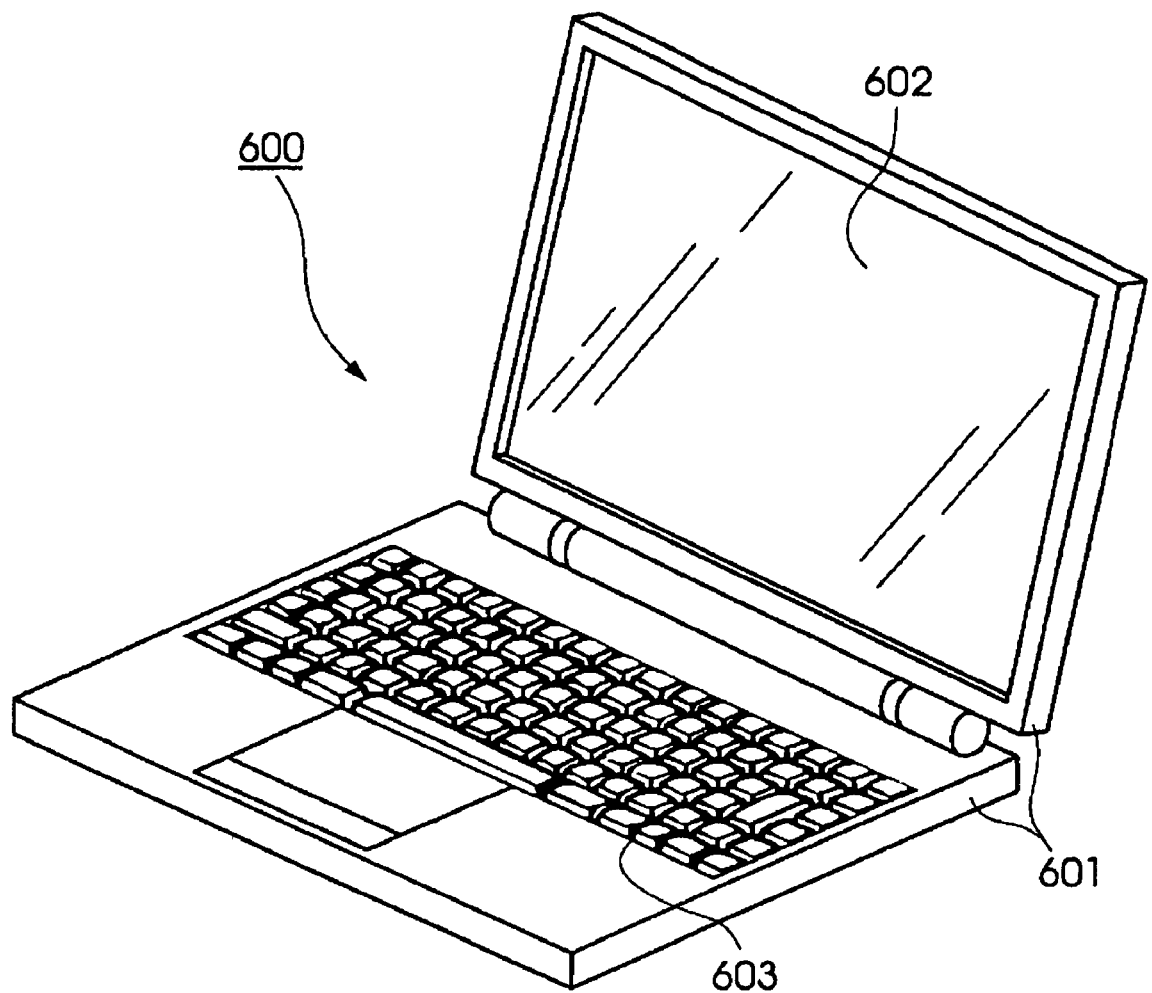

[Fig. 11]
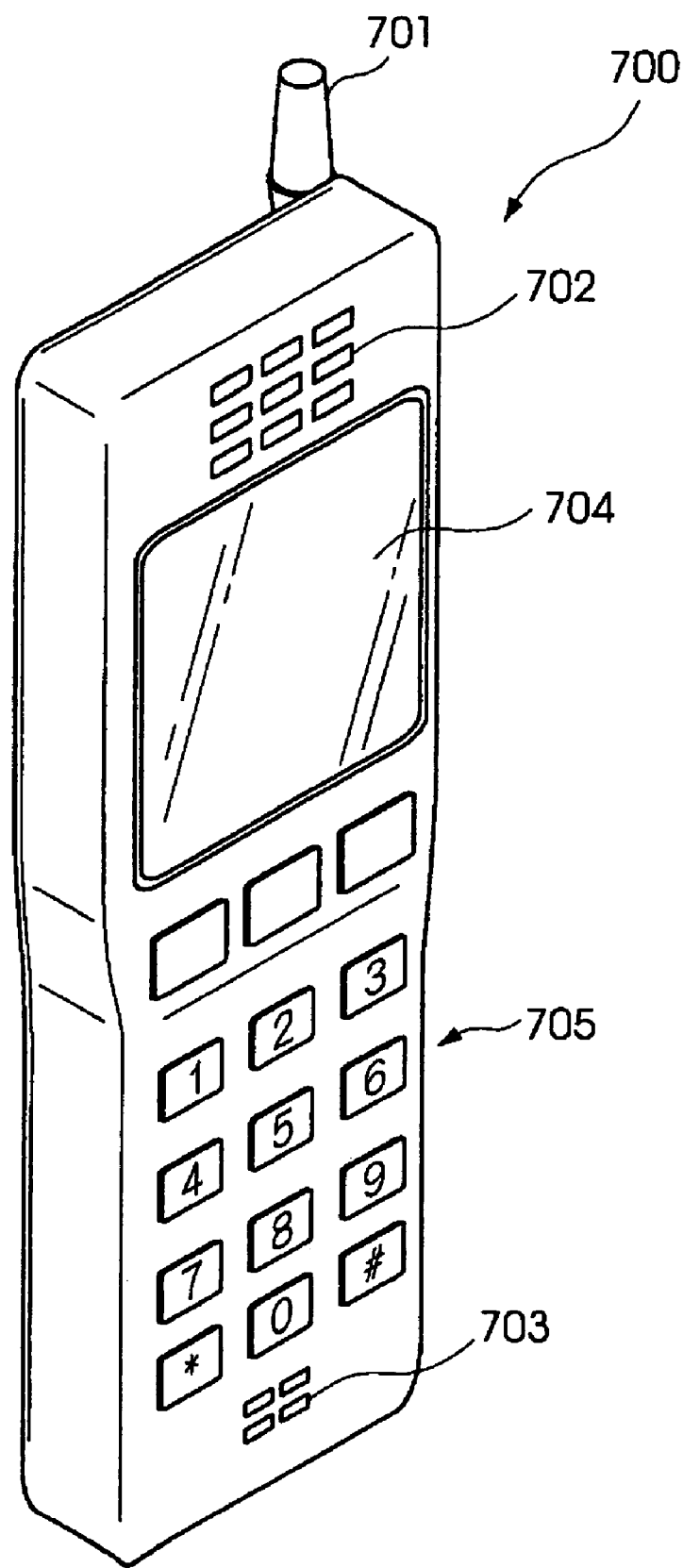

ELECTRO-OPTICAL DEVICE, WIRING SUBSTRATE, AND ELECTRONIC APPARATUS

BACKGROUND OF THE INVENTION

1. Field of Invention

The present invention relates to electro-optical devices and electronic apparatuses. The present invention particularly relates to an electro-optical device including current-driven electro-optical elements, such as organic electroluminescent elements. The invention also relates to an electronic apparatus including such an electro-optical device.

2. Description of Related Art

Related art electroluminescent devices that include pixels (discussed below) can be used in the next-generation of displays, as disclosed in, for example, International Publication No. WO 98/36407. These pixels each include corresponding light-emitting layers, each disposed between corresponding pixel electrodes and a counter electrode, to emit light when a current is applied between the pixel electrodes and the counter electrode.

In such electroluminescent devices in which light is emitted by applying a current, since the luminescence depends on the amount of current, the structure and layout of wiring to apply currents or driving voltages to pixels must be enhanced or optimized.

SUMMARY OF THE INVENTION

The present invention addresses the above and/or other situations, and provides an electro-optical device in which steady currents or driving voltages can be applied to pixels and also provide an electronic apparatus including such an electro-optical device.

In order to address or solve the above, an electro-optical device of the present invention includes a plurality of first electrodes disposed in an effective region on a substrate; a second electrode acting as a common electrode for a plurality of the first electrodes; a plurality of electro-optical elements that are each disposed between the second electrode and the corresponding first electrodes; first wiring lines to apply power-supply voltages to the first electrodes; and a second wiring line, connected to the second electrode, lying between the effective region and at least one of a plurality of sides of the substrate. The area of the second wiring line disposed on the substrate is larger than the total area of parts of the first wiring lines, the parts being disposed outside the effective region on the substrate.

According to the above electro-optical device, since the second wiring line, connected to the second electrode acting as a common electrode for a plurality of the first electrodes, lying on the substrate has a large area, the wiring resistance can be reduced, thereby applying steady currents to a plurality of the electro-optical elements.

If the area of a region located outside the effective region must be reduced or minimized, the area of the second wiring line disposed on the substrate is preferably larger than the total area of parts of the first wiring lines to apply power-supply voltages to the first electrodes, the parts being disposed outside the effective region on the substrate.

In the above electro-optical device, the term "effective region" is defined as a region having electro-optical functions or a region to display an image.

In the above electro-optical device, the second wiring line preferably has a portion having a width larger than that of the first wiring lines.

In the above electro-optical device, the width of the entire second wiring line may be larger than that of the first wiring lines.

In the above electro-optical device, a plurality of the electro-optical elements may each be placed between the second electrode and the corresponding first electrodes, and may each include corresponding light-emitting layers that emit light when currents are applied between the second electrode and the corresponding first electrodes. A plurality of the electro-optical elements may include a plurality of types of elements classified depending on the color of light emitted from the light-emitting layers, and the first wiring lines may be arranged depending on the color of emitted light.

In the above electro-optical device, the width of the second wiring line disposed outside the effective region may be larger than the width of part of one of the first wiring lines arranged depending on the type of the electro-optical elements, the part being disposed outside the effective region, the one being the widest of the first wiring lines.

In the above electro-optical device, the substrate may have a dummy region disposed between the effective region and at least one of a plurality of sides of the substrate, and the first wiring lines and the second wiring line may be arranged between the dummy region and at least one of a plurality of sides of the substrate.

In the above electro-optical device, the second electrode may cover at least the effective region and the dummy region.

In the above electro-optical device, a connection between the second wiring line and the second electrode preferably lies between the effective region and at least three of a plurality of sides of the substrate.

As described above, since the connection between the second wiring line and the second electrode has a large area, problems, such as unstable current, can be reduced or eliminated.

In the above electro-optical device, a plurality of the first electrodes are preferably each included in corresponding pixel electrodes arranged in the effective region and each include a plurality of control lines to transmit signals to control the pixel electrodes, and a plurality of the control lines are preferably arranged such that each control line and at least one of the first wiring lines and the second wiring line do not cross on the substrate.

When the control line and each first wiring line or the second wiring line cross, a parasitic capacitance is formed between the control line and the first wiring line or between the control line and the second wiring line. Thereby, the following phenomena are caused in some cases: signals transmitted to the control lines are delayed and dull signals are transmitted. However, since the control lines are arranged such that each control line and the first wiring line or the second wiring line do not cross, problems including the delay in transmitting signals to the control lines and such dull signals can be reduced or eliminated.

In the above electro-optical device, the control lines may each include corresponding scanning lines to transmit scanning signals to the corresponding pixel electrodes and also each include corresponding data lines to transmit data signals to the corresponding pixel electrodes.

In the above electro-optical device, the electro-optical elements may each include corresponding hole injection/transport layers and corresponding light-emitting layers containing an organic electroluminescent material, each hole injection/transport layer and light-emitting layer being stacked.

An electronic apparatus of the present invention includes the above electro-optical device.

A wiring substrate, used for electro-optical devices each including electro-optical elements each disposed between a plurality of corresponding first electrodes and a second electrode acting as a common electrode for the first electrodes, includes a plurality of first electrodes disposed on a substrate, first wiring lines to apply power-supply voltages to the first electrodes, and a second wiring line connected to the second electrode. The second electrode is disposed outside an effective region having the first electrodes therein, and the area of the second wiring line disposed on the substrate is larger than the total area of parts of the first wiring lines, the parts being disposed outside the effective region on the substrate.

BRIEF DESCRIPTION OF THE DRAWINGS

FIG. 1 is a schematic showing a wiring structure of an electro-optical device according to an exemplary embodiment of the present invention;

FIG. 2 is a schematic plan view showing the electro-optical device according to the exemplary embodiment of the present invention;

FIG. 3 is a sectional view taken along plane A–A' of FIG. 2;

FIG. 4 is a sectional view taken along plane B–B' of FIG. 2;

FIG. 5 is a sectional view showing a main part of a pixel electrode cluster region 11a;

FIGS. 6(a)–6(d) are schematics showing steps of manufacturing the electro-optical device according to the exemplary embodiment of the present invention;

FIGS. 7(a)–7(c) are schematics showing steps of manufacturing the electro-optical device according to the exemplary embodiment of the present invention;

FIGS. 8(a)–8(c) are schematics showing steps of manufacturing the electro-optical device according to the exemplary embodiment of the present invention;

FIGS. 9(a)–9(c) are schematics showing steps of manufacturing the electro-optical device according to the exemplary embodiment of the present invention;

FIG. 10 is a schematic perspective view showing an exemplary electronic apparatus including an electro-optical device according to an exemplary embodiment of the present invention;

FIG. 11 is a schematic perspective view showing a mobile phone illustrating another exemplary electronic apparatus.

DETAILED DESCRIPTION OF PREFERRED EMBODIMENTS

An electro-optical device and electronic apparatus according to the present invention is described in detail below with reference to the attached drawings. In the following drawings, in order to show each layer and member in the drawings on a recognizable scale, different scales are used for showing the layers and members. FIG. 1 is a schematic showing a wiring structure of an electro-optical device according to an exemplary embodiment of the present invention.

The electro-optical device 1 shown in FIG. 1 is an active matrix type organic EL device including thin-film transistors (hereinafter "TFTs") functioning as switching elements. As shown in FIG. 1, the electro-optical device 1 of this exemplary embodiment includes a plurality of scanning lines 101, signal lines 102 extending such that each signal lines 102 and each scanning line 101 cross, and a plurality of luminescent power-supply lines 103 extending in parallel to the signal lines 102, and has pixel regions A each disposed in the vicinities of corresponding intersections of the scanning lines 101 and signal lines 102. The scanning lines 101 and signal lines 102 are herein defined as parts of control lines.

The signal lines 102 are connected to a data driving circuit 104 including a shift register, a level shifter, video lines, and analogue switches. The signal lines 102 are also connected to an inspection circuit 106 including TFTs. The scanning lines 101 are connected to scanning driving circuits 105 another shift register and level shifter.

A pixel circuit including the following components is disposed in each pixel region A: a switching TFT 112, a capacitor Cap, a current TFT 123, a pixel electrode (first electrode) 111, a light-emitting layer 110, and a cathode (second electrode) 12. The switching TFT 112 includes a gate electrode connected to each scanning line 101 and is turned on or off depending on scanning signals transmitted from the scanning line 101. The capacitor Cap stores a pixel signal transmitted via the switching TFT 112 from each signal line 102.

The current TFT 123 includes a gate electrode connected to the switching TFT 112 and the capacitor Cap. The pixel signal stored in the capacitor Cap is transmitted to this gate electrode. The pixel electrode 111 is connected to the current TFT 123, whereby a driving current is applied to the pixel electrode 111 from each luminescent power-supply line 103 when the pixel electrode 111 is electrically connected to the luminescent power-supply line 103 with the current TFT 123 disposed therebetween. The light-emitting layer 110 is disposed between the pixel electrode 111 and the cathode 12.

The light-emitting layers 110 include three types of layers: red light-emitting layers 110R to emit red light, green light-emitting layers 110G to emit green light, and blue light-emitting layers 110B to emit blue light. The red, green, and blue light-emitting layers 110R, 110G, and 110B are arranged in a striped pattern. Red, green, and blue luminescent power-supply lines 103R, 103G, and 103B are connected to the red, green, and blue light-emitting layers 110R, 110G, and 110B, respectively, with the current TFTs 123 each disposed therebetween and also connected to a luminescent power-supply circuit 132. Since the driving potentials of the red, green, and blue light-emitting layers 110R, 110G, and 110B are different from each other, the red, green, and blue luminescent power-supply lines 103R, 103G, and 103B are arranged depending on color.

In the electro-optical device 1 of the present invention, first capacitors $C_1$ are each disposed between the cathode 12 and each of the red, green, and blue luminescent power-supply lines 103R, 103G, and 103B. When the electro-optical device 1 is turned on, charges are stored in the first capacitors $C_1$. When the potentials of driving currents flowing in the luminescent power-supply lines 103 fluctuate during the operation of the electro-optical device 1, the stored charges are supplied to the luminescent power-supply lines 103, thereby reducing the potential fluctuation of the driving currents. Thus, the electro-optical device 1 can normally display an image.

In the electro-optical device 1, when scanning signals are transmitted to the switching TFTs 112 from the scanning lines 101 and thereby the switching TFTs 112 are turned on, the potentials of the signal lines 102 are stored in the capacitors Cap. The current TFTs 123 are then turned on or off depending on the potentials stored in the capacitors Cap. Driving currents are applied to the pixel electrodes 111 via channels of the current TFTs 123 from the red, green, and blue luminescent power-supply lines 103R, 103G, and 103B, and currents are applied to the cathode 12 via the red, green, and blue light-emitting layers 110R, 110G, and 110B. In this operation, light is emitted from the light-emitting layers 110. The quantity of the emitted light depends on the quantity of currents flowing in the light-emitting layers 110.

A particular configuration of the electro-optical device 1 according to this exemplary embodiment is described below with reference to FIGS. 2 to 4. FIG. 2 is a schematic plan view showing the electro-optical device 1, FIG. 3 is a sectional view taken along plane A–A' of FIG. 2, and FIG. 4 is a sectional view taken along plane B–B' of FIG. 2. As shown in FIG. 2, the electro-optical device 1 includes a substrate 2; a pixel electrode cluster region (not shown); the luminescent power-supply lines 103 (103R, 103G, and 103B); and display pixel section 3 (the section surrounded by the dotted-chain line in the figure).

The substrate 2 includes, for example, a transparent material, such as glass. The pixel electrode cluster region contains pixel electrodes (not shown) connected to the current TFTs 123 and arranged on the substrate 2 in a matrix. As shown in FIG. 2, the luminescent power-supply lines 103 (103R, 103G, and 103B) are arranged around the pixel electrode cluster region and each connected to the corresponding pixel electrodes. The display pixel section 3 is disposed above at least the pixel electrode cluster region and has substantially a rectangular shape when viewed from above. The display pixel section 3 is partitioned into an actual display region 4 (the region surrounded by the two-dot chain line in the figure) placed at the center area and a dummy region 5 (the region between the dotted line and the two-dot line) placed around the actual display region 4 (this region may be referred to as an effective display region).

In the figure, the scanning driving circuits 105 described above are disposed at both sides of the actual display region 4. The scanning driving circuits 105 are placed on the back of the dummy region 5 (that is, on the side close to the substrate 2). Furthermore, scanning line-driving circuit control signal lines 105a and scanning line-driving circuit power-supply lines 105b connected to the scanning driving circuits 105 are placed on the back of the dummy region 5. The inspection circuit 106 is disposed above the actual display region 4. The inspection circuit 106 placed on the back of the dummy region 5 (that is, on the side close to the substrate 2). The quality and defects of the electro-optical device 1 can be checked using the inspection circuit 106 during the manufacture thereof or at the time of the delivery thereof.

As shown in FIG. 2, the red, green, and blue luminescent power-supply lines 103R, 103G, and 103B are arranged around the dummy region 5. The red, green, and blue luminescent power-supply lines 103R, 103G, and 103B extend from the back of the substrate 2, extend upward along the scanning line-driving circuit power-supply lines 105b, bend at the positions that the scanning line-driving circuit power-supply lines 105b terminate, and further extend along the outside of the dummy region 5 such that the red, green, and blue luminescent power-supply lines 103R, 103G, and 103B are connected to the pixel electrodes (not shown) disposed in the actual display region 4. A first cathode line 12a connected to the cathode 12 is disposed on the substrate 2. The first cathode line 12a has substantially a "C" shape when viewed from above and are arranged such that the cathode 12 surrounds the red, green, and blue luminescent power-supply lines 103R, 103G, and 103B. The substrate 2 serves as a first substrate, and has a plurality of sides. As shown in FIG. 2, the substrate 2 has a first side at the top above the effective display region 4, a second side at the bottom below the effective display region 4, and two additional sides on the left hand side and the right hand side of the effective display region 4, respectively. The first side of the substrate 2 is opposite to the second side of the substrate 2. As shown in FIG. 2, the first cathode electrode (second electrode) 12a extends along three sides of the substrate 2, with a part (the middle part of the "C" shape) between the first side of the substrate 2 and the effective display region 4.

The actual display region 4 and the dummy region 5 are surrounded by the first cathode line 12a and the red, green, and blue luminescent power-supply lines 103R, 103G, and 103B. A plurality of the scanning lines 101 shown in FIG. 1 are arranged in the actual display region 4 and the signal lines 102 extend such that each signal line 102 and scanning line 101 cross. That is, the scanning lines 101 and the signal lines 102 are arranged in an area on the substrate 2 such that the area is surrounded by the first cathode line 12a and the red, green, and blue luminescent power-supply lines 103R, 103G, and 103B on three sides.

The first cathode line 12a and the red, green, and blue luminescent power-supply lines 103R, 103G, and 103B, which are characteristic of the present invention, are described below. As shown in FIG. 1, currents applied from the red, green, and blue luminescent power-supply lines 103R, 103G, and 103B to the light-emitting layers 110 flow into the cathode 12 (first cathode line 12a). Thus, an increase in resistance of the first cathode line 12a, of which the width is limited, causes a serious voltage drop. Therefore, the voltage of the first cathode line 12a fluctuates depending on the position, thereby causing wrong image display such as low contrast.

In this exemplary embodiment, in order to prevent such a problem, the first cathode line 12a has an area larger than that of each of the red, green, and blue luminescent power-supply lines 103R, 103G, and 103B. The first cathode line 12a preferably has a large area in order to obtain a low resistance. However, the area of the first cathode line 12a is limited to a certain extent because various wiring lines are arranged on the substrate 2, as shown in FIG. 2.

On the assumption that the first cathode line 12a has the same resistance per unit length as that of each of the red, green, and blue luminescent power-supply lines 103R, 103G, and 103B, the following configuration has been designed. At least part of the first cathode line 12a has a width larger than that of each of the red, green, and blue luminescent power-supply lines 103R, 103G, and 103B and therefore the first cathode line 12a has an area larger than that of each of the red, green, and blue luminescent power-supply lines 103R, 103G, and 103B. In the configuration shown in FIG. 2, the entire first cathode line 12a has a width larger than that of each of the red, green, and blue luminescent power-supply lines 103R, 103G, and 103B.

Assuming that the same voltage is applied to the red, green, and blue luminescent power-supply lines 103R, 103G, and 103B; the red, green, and blue luminescent power-supply lines 103R, 103G, and 103B have the same width; the same current flows in the red, green, and blue luminescent power-supply lines 103R, 103G, and 103B; and all the light-emitting layers 110 have the same electric properties. The total of the currents flowing in the light-emitting layers 110 and the red, green, and blue luminescent power-supply lines 103R, 103G, and 103B flows into the first cathode line 12a. Thus, in order to cause the voltage drop in the first cathode line 12a to remain within the same order of magnitude as that of the red, green, and blue luminescent power-supply lines 103R, 103G, and 103B, the first cathode line 12a preferably has a width larger than the total of the width of the red, green, and blue luminescent power-supply lines 103R, 103G, and 103B.

However, in the electro-optical device 1 of this exemplary embodiment, the light-emitting layers 110 have different properties depending on color; different voltages are applied to the red, green, and blue luminescent power-supply lines 103R, 103G, and 103B depending on color; and therefore different currents flow. Therefore, in this exemplary embodiment, the first cathode line 12a preferably has a width larger than that of one luminescent power-supply line in which the largest current flows (that is, the largest voltage drop is caused). The other luminescent power-supply lines have a smaller width because smaller voltages are applied and therefore smaller currents flow, as compared with this line.

Thus, the first cathode line 12a has a width larger than that of the red, green, and blue luminescent power-supply lines 103R, 103G, and 103B. The first cathode line 12a and the red, green, and blue luminescent power-supply lines 103R, 103G, and 103B are designed in such a manner. In the configuration shown in FIG. 2, the entire first cathode line 12a has a width larger than that of the red, green, and blue luminescent power-supply lines 103R, 103G, and 103B. However, at least part of the first cathode line 12a may have a width larger than that of the red, green, and blue luminescent power-supply lines 103R, 103G, and 103B depending on the arrangement of the lines.

As shown in FIG. 2, a polyimide tape 130 is provided at one end of the substrate 2 and a control integrated circuit (control IC) 131 is mounted on the polyimide tape 130. The control IC 131 includes the data-side driving circuit 104, a cathodic power-supply circuit 131, and the luminescent power-supply circuit 132. The polyimide tape 130 serves as a second substrate, and is mounted at the second side of the substrate 2, as shown in FIG. 2.

As shown in FIGS. 3 and 4, the substrate 2 has a circuit section 11 thereon and the display pixel section 3 is disposed on the circuit section 11. The substrate 2 includes a sealing member 13 surrounding the display pixel section 3 and further includes a sealing substrate 14 disposed above the display pixel section 3. The sealing substrate 14 and the substrate 2 are joined each other with the sealing member 13 disposed therebetween. The sealing substrate 14 includes glass, metal, a resin, or the like. An adsorbent 15 is disposed on the back of the sealing substrate 14 in an adhered manner and adsorbs moisture and/or oxygen leaking in a space between the display pixel section 3 and the sealing substrate 14. A getter may be used instead of the adsorbent 15. The sealing member 13 includes, for example, a thermosetting resin or an ultraviolet-setting resin, and preferably includes an epoxy resin, which is one of thermosetting resins, in particular.

A pixel electrode cluster region 11a is disposed at the center of the circuit section 11. The pixel electrode cluster region 11a contains the current TFTs 123 and the pixel electrodes 111 connected to the current TFTs 123. The current TFTs 123 are placed below a base-protecting layer 281, a second interlayer-insulating layer 283, and a first interlayer-insulating layer 284 arranged on the substrate 2 in that order. The pixel electrodes 111 are disposed on the first interlayer-insulating layer 284. Each current TFT 123 has a source electrode disposed on the second interlayer-insulating layer 283 and the source electrode is connected to each luminescent power-supply line 103 (103R, 103G, or 103B). The capacitors Cap and the switching TFTs 112 are disposed in the circuit section 11, which are not shown in FIGS. 3 and 4. The signal lines 102 are also not shown in FIGS. 3 and 4. Furthermore, the switching TFTs 112 and the current TFTs 123 are not shown in FIG. 4.

As shown in FIG. 3, the scanning driving circuits 105 are disposed at both sides of the pixel electrode cluster region 11a. As shown in FIG. 4, the inspection circuit 106 is disposed at the left side of the pixel electrode cluster region 11a. Each scanning driving circuit 105 includes first TFTs 105c, which are of n or p-channel type and are components of an inverter included in the shift register. The first TFTs 105c have the same configuration as that of the current TFTs 123 except that the first TFTs 105c are not connected to the pixel electrodes 111. The inspection circuit 106 includes second TFTs 106a. The second TFTs 106a have the same configuration as that of the current TFTs 123 except that the second TFTs 106a are not connected to the pixel electrodes 111.

As shown in FIG. 3, the scanning line-driving circuit control signal lines 105a are each disposed at corresponding areas that are each located outside the corresponding scanning driving circuits 105 and located on the base-protecting layer 281. Furthermore, the scanning line-driving circuit power-supply lines 105b are each disposed at corresponding areas outside the corresponding scanning line-driving circuit control signal lines 105a and located on the second interlayer-insulating layer 283. As shown in FIG. 4, the inspection-circuit control signal line 106b is disposed at an area that is located on the left side of the inspection circuit 106 and located on the base-protecting layer 281. Furthermore, the inspection-circuit power-supply line 106c is disposed at an area that is located on the left side of the inspection-circuit control signal line 106b and located on the second interlayer-insulating layer 283. The luminescent power-supply lines 103 are disposed outside the regions where the scanning line-driving circuit power-supply lines 105b are disposed. The luminescent power-supply lines 103 have a dual wiring structure consisting of two-types of wiring lines and are arranged outside the display pixel section 3. Such a dual wiring structure provides low resistance.

For example, one of the red luminescent power-supply lines 103R disposed at a left area of FIG. 3 includes a first red line $103R_1$ disposed on the base-protecting layer 281 and a second red line $103R_2$ disposed above the first red line $103R_1$ with the second interlayer-insulating layer 283 disposed therebetween. As shown in FIG. 2, the first red line $103R_1$ is connected to the second red line $103R_2$ with a contact hole $103R_3$ extending through the second interlayer-insulating layer 283. The first red line $103R_1$ and the first cathode line 12a are disposed on the same layer and the second interlayer-insulating layer 283 lies between the first red line $103R_1$ and the first cathode line 12a. As shown in FIGS. 3 and 4, the first cathode line 12a is electrically connected to a second cathode line 12b, disposed on the second interlayer-insulating layer 283, with a contact hole. That is, the first cathode line 12a also has a dual wiring structure. The second red line $103R_2$ and the second cathode line 12b are disposed on the same layer and the first interlayer-insulating layer 284 lies between the second red line $103R_2$ and the second cathode line 12b. Such a configuration provides second capacitors $C_2$ that are each disposed between the first red line $103R_1$ and the first cathode line 12a and also disposed between the second red line $103R_2$ and the second cathode line 12b.

The green and blue luminescent power-supply lines 103G and 103B also have a dual wiring structure. The green and blue luminescent power-supply lines 103G and 103B each include a first green line $103G_1$ and a first blue line $103B_1$, respectively, both disposed on the base-protecting layer 281 and also each include a second green line $103G_2$ and a second blue line $103B_2$, respectively, both disposed on the second interlayer-insulating layer 283. As shown in FIGS. 2 and 3, the first green line $103G_1$ is connected to the second green line $103G_2$ with a green contact hole $103G_3$ extending through the second interlayer-insulating layer 283, and the first blue line $103B_1$ is connected to the second blue line $103B_2$ with a blue contact hole $103B_3$ extending through the second interlayer-insulating layer 283. The second capacitors $C_2$ are each disposed between the first blue line $103B_1$ and the first cathode line 12a and also disposed between the second blue line $103B_2$ and the second cathode line 12b.

The distance between the first and second red lines $103R_1$ and $103R_2$ is preferably 0.6 to 1.0 μm. When the distance is smaller than 0.6 μm, the parasitic capacitance between source lines and gate lines, as well as the signal lines 102 and the scanning lines 101, having different potentials is increased, which is not preferable. For example, in the actual display region 4, there are many crossover sites of the source lines and gate lines. Therefore, there is a problem in that the delay of data signals is caused due to a large parasitic capacitance. Thus, the data signals cannot be written in the pixel electrodes 111 in a predetermined period, thereby causing low contrast. The second interlayer-insulating layer 283 disposed between the first and second red luminescent power-supply lines $103R_1$ and $103R_2$ preferably includes $SiO_2$ or the like. When the second interlayer-insulating layer 283 has a thickness of 1.0 μm or more, there is a problem in that the substrate 2 cracks due to the stress of $SiO_2$.

As shown in FIG. 4, the luminescent power-supply lines 103 has a dual wiring structure. The area of each luminescent power-supply line 103 is herein defined as the area of a line (for example, each second red line $103R_2$, second green line $103G_2$, or second blue line $103B_2$) included in the dual wiring structure.

The cathode 12 extending from the display pixel section 3 is disposed above the red luminescent power-supply lines 103R. That is, the second red lines $103R_2$ of the red luminescent power-supply lines 103R face the cathode 12, with the first interlayer-insulating layer 284 disposed therebetween. Such a configuration discloses each of the first capacitors $C_1$ between the cathode 12 and the corresponding second red lines $103R_2$.

The distance between the second red lines $103R_2$ and the cathode 12 is preferably, for example, 0.6 to 1.0 μm. When the distance is smaller than 0.6 μm, the parasitic capacitance between pixel electrodes and source lines having different potentials is increased, thereby the delay of data signals in signal lines including the source lines. Thus, the data signals cannot be written in a predetermined period, thereby causing low contrast. The first interlayer-insulating layer 284 disposed between the second red luminescent power-supply lines $103R_2$ and the cathode 12 preferably comprises $SiO_2$, an acrylic resin, or the like. When the first interlayer-insulating layer 284 includes $SiO_2$ and has a thickness of 1.0 μm or more, there is a problem in that the substrate 2 cracks due to the stress of $SiO_2$. When the first interlayer-insulating layer 284 includes such an acrylic resin, the first interlayer-insulating layer 284 may have a thickness of about 2.0 μm. However, since the acrylic resin expands when it contains moisture, there is a problem in that pixel electrodes formed on the first interlayer-insulating layer 284 crack.

As described above, in the electro-optical device 1 of the present invention, since the first capacitors $C_1$ are each disposed between the corresponding luminescent power-supply lines 103 and the cathode 12, charges stored in the first capacitors $C_1$ are supplied to the luminescent power-supply lines 103 when the potential of currents flowing in the luminescent power-supply lines 103 fluctuates. That is, the charges compensate for potential shortfalls of driving currents, thereby reducing the potential fluctuation. Thus, the image display of the electro-optical device 1 can be normally maintained. In particular, since the luminescent power-supply lines 103 extend along the cathode 12 disposed outside the display pixel section 3, the distance between the luminescent power-supply lines 103 and the cathode 12 can be reduced such that charges stored in the first capacitors $C_1$ are decreased, thereby reducing the potential fluctuation. Thus, a stable image can be displayed. Furthermore, the luminescent power-supply lines 103 each have a dual wiring structure including first and second wiring lines and the second capacitors $C_2$ are each disposed between the corresponding first wiring lines and the corresponding cathode lines, charges stored in the second capacitors $C_2$ are also supplied to the luminescent power-supply lines 103, thereby further reducing the potential fluctuation. Thus, the image display of the electro-optical device 1 can be normally maintained.

A configuration of the circuit section 11 including the current TFTs 123 is described in detail below. FIG. 5 is a sectional view showing a main part of the pixel electrode cluster region 11a. As shown in FIG. 5, the base-protecting layer 281 containing $SiO_2$ as a main component is disposed on the substrate 2 and first silicon layers 241 are arranged on the base-protecting layer 281 in a dotted manner. The first silicon layers 241 and the base-protecting layer 281 are covered with a gate-insulating layer 282 containing $SiO_2$ and/or SiN as a main component. First gate electrodes 242 are arranged above first silicon layers 241 with the gate-insulating layer 282 disposed therebetween.

A sectional configuration of each current TFT 123 is shown FIG. 5. Each switching TFT 112 has the same configuration as that of the current TFT 123. The first gate electrodes 242 and the gate-insulating layer 282 are covered with the second interlayer-insulating layer 283 containing $SiO_2$ as a main component. The term "main component" is herein defined as a component having the highest content.

Each first silicon layer 241 includes a channel region 241a facing each first gate electrode 242, with the gate-insulating layer 282 disposed therebetween. In each first silicon layer 241, a first lightly doped source region 241b and a first heavily doped source region 241S are disposed on the right side of the channel region 241a in that order. Furthermore, a first lightly doped drain region 241c and a first heavily doped drain region 241D are disposed on the left side of the channel region 241a in that order. These regions form a so-called lightly doped drain (LDD) structure. The first silicon layers 241 is a main component of each current TFT 123.

The first heavily doped source region 241S is connected to each first source electrode 243 with each first contact hole 244 extending through the gate-insulating layer 282 and the second interlayer-insulating layer 283. The first source electrode 243 is a component of each signal line 102 described above. On the other hand, the first heavily doped drain region 241D is connected to each first drain electrode 245, disposed in the same layer as that of the source electrode 243, with each second contact hole 246 extending through the gate-insulating layer 282 and the second interlayer-insulating layer 283.

The first interlayer-insulating layer 284 is disposed on the second interlayer-insulating layer 283 having the first source electrode 243 and the first drain electrode 245 thereon. Each transparent pixel electrode 111 comprising ITO and so on is disposed on the first interlayer-insulating layer 284 and connected to the first drain electrode 245 with each third contact hole 111a extending through the first interlayer-insulating layer 284. That is, the pixel electrode 111 is connected to the first heavily doped drain region 241D of the first silicon layer 241 with the first drain electrode 245. As shown in FIG. 3, the pixel electrodes 111 are arranged in an area corresponding to the actual display region 4 and dummy pixel electrodes 111' are arranged in an area corresponding to the dummy display region 5. The dummy pixel electrodes 111' have substantially the same configuration as that of the pixel electrodes 111 except that each dummy pixel electrode 111' is not connected to the first heavily doped drain region 241D.

The light-emitting layers 110 and a bank portion 122 are disposed in the actual display region 4 of the display pixel section 3. As shown in FIGS. 3 to 5, the light-emitting layers 110 are each placed on the corresponding pixel electrodes 111. The bank portion 122 is disposed between pairs of the pixel electrodes 111 and the light-emitting layers 110, thereby separating the light-emitting layers 110. The bank portion 122 includes an inorganic bank layer 122a, disposed at a position close to the substrate 2, and an organic bank layer 122b, disposed at a position far from the substrate 2. The organic bank layer 112b is disposed on the inorganic bank layer 112a. A light-shielding layer may be placed between the inorganic bank layer 122a and the organic bank layer 122b.

Part of the inorganic bank layer 122a and part of the organic bank layer 122b are disposed on the periphery of each pixel electrode 111 in that order. The inorganic bank layer 122a extends to a position closer to the center of the circuit section 11 as compared with the organic bank layer 122b. The inorganic bank layer 122a preferably includes an inorganic material, such as $SiO_2$, $TiO_2$, or SiN. The inorganic bank layer 122a preferably has a thickness of 50 to 200 nm, and more preferably about 150 nm. When the thickness is smaller than 50 nm, the inorganic bank layer 122a is thinner than each hole injection/transport layer described below and therefore the flatness of the hole injection/transport layer cannot be achieved. When the thickness is larger than 200 nm, a step due to the inorganic bank layer 122a has a large height and therefore the flatness of each light-emitting layer 110 lying on the hole injection/transport layer cannot be achieved.

The organic bank layer 122b includes an ordinary resist material, such as an acrylic resin or a polyimide resin. The organic bank layer 122b preferably has a thickness of 0.1 to 3.5 μm, and more preferably about 2 μm. When the thickness is smaller than 0.1 μm, the total of the hole injection/transport layer thickness and the light-emitting layer 110 thickness exceeds the thickness of the organic bank layer 122b, thereby causing a problem in that a material contained in the light-emitting layer 110 extends out of the upper opening. When the thickness is larger than 3.5 μm, a step disposed at the upper opening has a large height and therefore the step coverage of the cathode 12 disposed on the organic bank layer 122b cannot be sufficiently achieved. When the thickness is about 2 μm, the cathode 12 can be securely insulated from the pixel electrode 111. Thus, the light-emitting layer 110 has a thickness smaller than that of the bank portion 122.

The bank portion 122 has lyophilic regions and lyophobic regions. The lyophilic regions are disposed on the inorganic bank layer 122a and the pixel electrodes 111. Lyophilic groups, such as hydroxyl groups, formed by plasma treatment using oxygen as reactive gas are disposed in these regions. The lyophobic regions are disposed on the organic bank layer 122b. Lyophobic groups, such as fluorine groups, formed by plasma treatment using tetrafluoromethane as reactive gas are disposed in these regions.

As shown in FIG. 5, the light-emitting layers 110 are each disposed on corresponding hole injection/transport layers 110a, each being disposed on the corresponding pixel electrodes 111. A configuration including each light-emitting layer 110 and each hole injection/transport layer 110a is herein defined as a functional layer, and a configuration including each pixel electrode 111, the functional layer, and the cathode 12 is herein defined as an light-emitting element. The hole injection/transport layer 110a has a function of injecting holes to the light-emitting layer 110 and also has a function of transport holes in the hole injection/transport layer 110a. Since the hole injection/transport layer 110a is disposed between the pixel electrode 111 and the light-emitting layer 110, the light-emitting layer 110 has enhanced element properties, such as light-emitting efficiency and life. In the light-emitting layer 110, fluorescence occurs when holes injected from the hole injection/transport layer 110a combine with electrons supplied from the cathode 12 combine. The light-emitting layers 110 include three types of layers: a red light-emitting layer to emit red light, a green light-emitting layer to emit green light, and a blue light-emitting layer to emit blue light. As shown in FIGS. 1 and 2, these layers are arranged in a striped pattern.

As shown in FIGS. 3 and 4, the dummy region 5 of the display pixel section 3 includes dummy light-emitting layers 210 and a dummy bank portion 212. The dummy bank portion 212 includes a dummy inorganic bank layer 212a disposed at a position close to the substrate 2, and a dummy organic bank layer 212b disposed at a position far from the substrate 2. The dummy organic bank layer 212b is disposed on the dummy inorganic bank layer 212a. The dummy inorganic bank layer 212a is disposed over the dummy pixel electrodes 111'. The dummy organic bank layer 212b is disposed between the pixel electrodes 111 in the same manner as that of the organic bank layer 122b. The dummy light-emitting layers 210 are each arranged above the corresponding dummy pixel electrodes 111', with the dummy inorganic bank layer 212a disposed therebetween.

The dummy inorganic bank layer 212a includes the same material and have the same thickness as the material and thickness of the inorganic bank layer 122a described above, and the dummy organic bank layer 212b includes the same material and have the same thickness as the material and thickness of the organic bank layer 122b described above. The dummy light-emitting layers 210 are each disposed on corresponding dummy hole injection/transport layers, which are not shown. The dummy hole injection/transport layers have substantially the same configuration as that of the hole injection/transport layers 110a, and the dummy light-emitting layers 210 have substantially the same configuration as that of the light-emitting layers 110. Thus, the dummy light-emitting layers 210, as well as the light-emitting layers 110, have a thickness smaller than that of the dummy bank portion 212.

Since the dummy region 5 is placed around the actual display region 4, the light-emitting layers 110 of the actual display region 4 have a uniform thickness, thereby reducing or preventing uneven display. That is, since the dummy region 5 is placed, an ejected ink composition can be dried under the same condition in the actual display region 4 when the display elements are formed by an inkjet process. Thereby, the light-emitting layers 110 disposed at the periphery of the actual display region 4 have substantially the same thickness as that of the other light-emitting layers 110.

The cathode 12 extends across the actual display region 4 and the dummy region 5 and further extends to positions above the substrate 2, the positions being disposed outside the dummy region 5. At the outside of the dummy region 5, that is, at the outside of the display pixel section 3, the cathode 12 is directly disposed above the luminescent power-supply lines 103. The periphery of the cathode 12 is in contact with substantially the entire first cathode line 12a. The cathode 12 acts as a counter electrode for the pixel electrodes 111 and has a function of transmitting currents to the light-emitting layers 110. The cathode 12 includes a cathode layer 12b including a lithium fluoride sub-layer and a calcium sub-layer and also includes a reflective layer 12c, the reflective layer 12c being disposed on the cathode layer 12b. In the cathode 12, only the reflective layer 12c extends outside the display pixel section 3. The reflective layer 12c has a function of reflecting light, emitted from the light-emitting layers 110, in the direction of the substrate 2 and preferably includes, for example, Al, Ag, or an Mg/Ag layered structure. A protective layer, including $SiO_2$, SiN, or the like, to reduce or prevent oxidation may be placed on the reflective layer 12c.

A method for manufacturing the electro-optical device 1 of the exemplary embodiment of the present invention is described below. FIGS. 6(a) to 9(c) are illustrations showing steps of manufacturing the electro-optical device 1. A procedure for forming the circuit section 11 on the substrate 2 is described below with reference to FIGS. 6(a) to 8(c). FIGS. 6(a) to 8(c) are sectional views taken along plane A–A' of FIG. 2. In the following description, the impurity concentration determined after activation annealing is used.

As shown in FIG. 6(a), the base-protecting layer 281 including silicon oxide or the like is formed on the substrate 2. An amorphous silicon layer is formed thereon by an ICVD process, a plasma CVD process, or the like. Crystal grains in the amorphous silicon layer is grown by a laser annealing process or a rapid heating process, thereby converting the amorphous silicon layer into a polysilicon layer 501. The polysilicon layer 501 is patterned by a photolithographic process such that the first silicon layers 241 and second and third silicon layers 251 and 261 are formed in a dotted manner, as shown in FIG. 6(b). The gate-insulating layer 282 comprising silicon oxide is then formed thereon.

Each first silicon layer 241 is a component of each current TFT 123 (hereinafter "pixel TFT" in some cases) that is disposed below the actual display region 4 and connected to each pixel electrode 111. Each second silicon layer 241 is a component of each p-channel type TFT and each third silicon layer 261 is a component of each n-channel type TFT. These TFTs are included in the scanning driving circuits 105 and are hereinafter referred to as "driving circuit TFTs" in some cases.

The gate-insulating layer 282 is formed by a plasma CVD process, a thermal oxidation process, or the like such that the gate-insulating layer 282 covers the base-protecting layer 281 and the first, second, and third silicon layers 241, 251, and 261 and has a thickness of about 30 to 200 nm. The gate-insulating layer 282 includes silicon oxide. If the gate-insulating layer 282 is formed by a thermal oxidation process, the first, second, and third silicon layers 241, 251, and 261 can be crystallized, thereby converting these silicon layers into polysilicon layers. In order to perform channel doping, for example, boron ions are implanted at a dose of about $1 \times 10^{12}$ $cm^{-2}$ during the above process. Thereby, the first, second, and third silicon layers 241, 251, and 261 are converted into lightly doped p-type silicon layers having an impurity concentration of about $1 \times 10^{-17}$ $cm^{-3}$.

As shown in FIG. 6(c), first ion-implanting selection masks $M_1$ each are formed on corresponding portions of the first and third silicon layers 241 and 261 and phosphorus ions are then implanted at a dose of about $1 \times 10^{15}$ $cm^{-2}$. As a result, a large amount of dopants are introduced into the silicon layers in such a manner that the dopants are self-aligned with respect to the ion-implanting selection masks $M_1$. Thereby, the first heavily doped source region 241S and the first heavily doped drain region 241D are formed in each first silicon layer 241, and a third heavily doped source region 261S and a third heavily doped drain region 261D are formed in each third silicon layer 261.

As shown in FIG. 6(d), after the ion-implanting selection masks $M_1$ are removed, doped silicon layers, silicide layers, or metal layers, such as aluminum layers, chromium layers, or tantalum layers are formed on the gate-insulating layer 282 such that the layers have a thickness of about 200 nm. The layers are then patterned, thereby forming the first gate electrodes 242 of pixel TFTs, second gate electrodes 252 of p-channel type TFTs for driving circuits, and third gate electrodes 262 of n-channel type TFTs for the driving circuits. During the patterning step, the following lines are simultaneously formed: the scanning line-driving circuit control signal lines 105a, the first red, green, and blue lines $103R_1$, $103G_1$, and $103B_1$ of the luminescent power-supply lines 103, and a portion of the first cathode line 12a.

Phosphorus ions are then implanted in the first, second, and third silicon layers 241, 251, and 261 at a dose of about $4 \times 10^{13}$ $cm^{-2}$ using the first, second, and third gate electrodes 242, 252, and 262 as masks. As a result, a small amount of dopants are introduced into the silicon layers in such a manner that the dopants are self-aligned with respect to the first, second, and third gate electrodes 242, 252, and 262. Thereby, as shown in FIG. 6(d), the first lightly doped source region 241b and the first lightly doped drain region 241c are formed in each first silicon layer 241, a third lightly doped source region 261b and a third lightly doped drain region 261c are formed in each third silicon layer 261. Furthermore, a second lightly doped source region 251S and a second lightly doped drain region 251D are formed in each second silicon layer 251.

As shown in FIG. 7(a), a second ion-implanting selection mask $M_2$ is formed over the substrate 2 other than the vicinities of the second gate electrodes 252. Boron ions are then implanted in the second silicon layers 251 at a dose of about $1.5 \times 10^{15}$ $cm^{-2}$ using the second ion-implanting selection mask $M_2$. The second gate electrodes 252 also function as masks, whereby the second silicon layers 251 are heavily doped with dopants in a self-aligned manner. Thereby, the second lightly doped source regions 251S and the second lightly doped drain regions 251D are counter-doped. As a result, each second lightly doped source region 251S and second lightly doped drain region 251D function as a source region and drain region, respectively, of each p-channel type TFT for the driving circuits.

As shown in FIG. 7(b), after the second ion-implanting selection mask $M_2$ is removed, the second interlayer-insulating layer 283 is formed over the substrate 2. The second interlayer-insulating layer 283 is then lithographically patterned to form first openings $H_1$ for forming contact holes at positions corresponding to the first cathode line 12a and the source and drain electrodes of the TFTs. As shown in FIG. 7(c), a conductive layer 504 containing metal, such as aluminum, chromium, or tantalum and having a thickness of about 200 to 800 m is formed over the second interlayer-insulating layer 283, thereby packing the metal into the first openings $H_1$ to form contact holes. Patterning masks $M_3$ are then formed on the conductive layer 504.

As shown in FIG. 8(a), the conductive layer 504 is patterned using the patterning masks $M_3$ to form the first source electrodes 243 and second and third source electrodes 253 and 263 of the TFTs; metal portions packed into the first contact holes 244 and second and third contact holes 245 and 246; the second red, green, and blue lines $103R_2$, $103G_2$, and $103B_2$ of the luminescent power-supply lines 103; the scanning line-driving circuit power-supply lines 105b; and the second cathode line 12b.

According to the above configuration, the first red and blue lines $103R_1$ and $103B_1$ and the first cathode line 12a are arranged on the same layer in a separated manner, whereby the second capacitors $C_2$ are formed.

After the above steps, as shown in FIG. 8(b), the first interlayer-insulating layer 284 including, for example, a resin material, such as an acrylic material, is formed over the second interlayer-insulating layer 283. The first interlayer-insulating layer 284 preferably has a thickness of about 1 to 2 μm. As shown in FIG. 8(c), in the first interlayer-insulating layer 284, portions corresponding to the first contact holes 244 are removed by an etching process to form second openings $H_2$ to form contact holes. In this procedure, a portion of the first interlayer-insulating layer 284 corresponding to the first cathode line 12a is also removed. Thereby, the circuit section 11 is formed on the substrate 2.

With reference to FIGS. 9(a)–9(c), the following procedure is described. The display pixel section 3 is formed on the circuit section 11 to obtain the electro-optical device 1. FIGS. 9(a)–9(c) are sectional views taken along plane A–A' of FIG. 2. As shown in FIG. 9(a), a thin-film including a transparent electrode material, such as ITO, is formed over the substrate 2, thereby packing such a material into the second openings $H_2$ disposed in the first interlayer-insulating layer 284, to form the third contact holes 111a. The formed thin-film is then patterned, whereby the pixel electrodes 111 and the dummy pixel electrodes 111' are formed. The pixel electrodes 111 are formed only in an area for forming the current TFTs 123 (switching elements) and are each connected to the current TFTs 123 with the third contact holes 111a. The dummy pixel electrodes 111' are arranged in a dotted manner.

As shown in FIG. 9(b), the inorganic bank layer 122a and the dummy inorganic bank layer 212a are formed over the first interlayer-insulating layer 284, the pixel electrodes 111, and the dummy pixel electrode 111'. The inorganic bank layer 122a has openings corresponding to the pixel electrodes 111 and the dummy inorganic bank layer 212a completely covers the dummy pixel electrode 111'. The inorganic bank layer 122a and the dummy inorganic bank layer 212a are formed according to the following procedure. An inorganic layer containing $SiO_2$, $TiO_2$, SiN, or the like are formed over the first interlayer-insulating layer 284 and the pixel electrodes 111, and the formed inorganic layer is then patterned.

Furthermore, as shown in FIG. 9(b), the organic bank layer 122b and the dummy organic bank layer 212b are formed on the inorganic bank layer 122a and the dummy inorganic bank layer 212a, respectively. The organic bank layer 122b disposed on the inorganic bank layer 122a has openings corresponding to the pixel electrodes 111 and the dummy organic bank layer 212b has openings from which parts of the dummy inorganic bank layer 212a appear. According to the above procedure, the bank portion 122 is formed on the first interlayer-insulating layer 284.

The lyophilic regions and the lyophobic regions are formed on the bank portion 122. In this exemplary embodiment, these regions are formed by a plasma-treating process. In particular, the plasma-treating process includes at least a lyophilicity-providing step of rendering the pixel electrodes 111, the inorganic bank layer 122a, and the dummy inorganic bank layer 212a lyophilic and a lyophobicity-providing step of rendering the organic bank layer 122b and the dummy organic bank layer 212b lyophobic.

Lyophilicity and lyophobicity are provided to predetermined regions according to the following procedure: the bank portion 122 is heated to a predetermined temperature (for example, about 70 to 80° C.); first plasma treatment ($O_2$ plasma treatment) using oxygen as reactive gas is performed in the atmosphere in the lyophilicity-providing step; second plasma treatment ($CF_4$ plasma treatment) using tetrafluoromethane as reactive gas is performed in the atmosphere in the lyophobicity-providing step; and the bank portion 122 heated for plasma treatment is then cooled to room temperature.

The light-emitting layers 110 are formed on the corresponding pixel electrodes 111 and the dummy light-emitting layers 210 are formed on corresponding potions of the dummy inorganic bank layer 112a by an inkjet process. The light-emitting layers 110 and the dummy light-emitting layers 210 are formed according to the following procedure. An ink composition containing a hole injection/transport material is discharged onto predetermined portions and then dried, and another ink composition containing a light-emitting material is discharged onto the portions and then dried. After the light-emitting layers 110 and the dummy light-emitting layers 210 are formed, in order to reduce or prevent the hole injection/transport material and the light-emitting material from being oxidized, subsequent steps are preferably performed in an inert gas atmosphere such as a nitrogen atmosphere or an argon atmosphere.

As shown in FIG. 9(c), the cathode 12 covers the bank portion 122, the light-emitting layers 110, and the dummy light-emitting layers 210. The cathode 12 is formed according to the following procedure. The cathode layer 12b is formed over the bank portion 122, the light-emitting layers 110, and the dummy light-emitting layers 210, and the reflective layer 12c connected to the first cathode line 12a disposed above the substrate 2 is formed over the cathode layer 12b. Therefore, the reflective layer 12c extends from the display pixel section 3 to positions above the substrate 2 such that the reflective layer 12c is connected to the first cathode line 12a, and the reflective layer 12c is disposed directly above the luminescent power-supply lines 103, with the first interlayer-insulating layer 284 disposed therebetween. Such a configuration provides the first capacitors $C_1$ such that each is disposed between the corresponding luminescent power-supply lines 103 and the reflective layer 12c, that is, the cathode 12. Finally, the sealing member 13 including an epoxy resin or the like is provided on the substrate 2 and the sealing substrate 14 is joined to the substrate 2 with the sealing member 13 disposed therebetween. According to the above procedure, the electro-optical device 1 shown in FIGS. 1 to 4 is completed.

For example, a notebook-type personal computer (electronic apparatus) 600 shown in FIG. 10 is manufactured by installing electronic components, such as an electro-optical device manufactured according to the above procedure, a motherboard including a central processing unit (CPU), a keyboard, and a hard disk, in a casing. FIG. 10 is a schematic perspective view showing an exemplary electronic apparatus including an electro-optical device according to an exemplary embodiment of the present invention. In FIG. 10, reference numeral 601 represents a casing, reference numeral 602 represents a liquid crystal display, and reference numeral 603 represents a keyboard. FIG. 11 is a schematic perspective view showing a mobile phone for illustrating another exemplary electronic apparatus. In FIG. 11, reference numeral 700 represents the mobile phone, reference numeral 701 represents an antenna, reference numeral 702 represents a receiver, reference numeral 703 represents a microphone, reference numeral 704 represents a liquid crystal display, and reference numeral 705 represents an operating button section.

In the above description, the notebook-type personal computer 600 and the mobile phone 700 are illustrated as electronic apparatuses. However, the present invention is not limited to such apparatuses and covers other electronic apparatuses, such as liquid crystal projectors, multimedia personal computers (PCs), multimedia engineering work stations (EWSs), pagers, word processors, televisions, viewfinder-type or direct view-type video tape recorders, electronic notebooks, portable electronic calculators, car navigation systems, POS terminals, and touch panel-including apparatus, for example.

[Advantages]

As described above, according to the present invention, a cathode line has an area larger than that of each power-supply line such that the cathode line has a small wiring resistance. Therefore, there is an advantage in that the voltage drop can be reduced. Thus, there is also an advantage in that steady image signals can be transmitted, thereby reducing or preventing erroneous image display, such as low contrast.

What is claimed is:

1. An electro-optical device, comprising:
a first substrate having a first end and a second end opposite from each other;
a plurality of first electrodes disposed in an effective region on the first substrate;
a second electrode acting as a common electrode for the plurality of first electrodes;
a plurality of electro-optical elements, each being disposed between the second electrode and a corresponding first electrode;
first wiring lines to apply power-supply voltages to the first electrodes; and
a second wiring line connected to the second electrode, at least a part of the second wiring line being disposed between the effective region and the first end of the first substrate;
a second substrate provided at the second end of the first substrate opposite from the first end of the first substrate; and
a control integrated circuit mounted on the second substrate, the control integrated circuit including a luminescent power-supply circuit electrically connected to the first wiring lines.

2. The electro-optical device according to claim 1, the second wiring line having a portion that has a width larger than each width of each of the first wiring lines.

3. The electro-optical device according to claim 1, a width of the entire second wiring line being larger than each width of each of the first wiring lines.

4. The electro-optical device according to claim 1,
each of the plurality of electro-optical elements being placed between the second electrode and the corresponding first electrode, and each including corresponding light-emitting layers that emit light when currents are applied between the second electrode and the corresponding first electrode,
the plurality of electro-optical elements including a plurality of types of elements classified depending on the color of light emitted from the light-emitting layers, and
the first wiring lines being arranged depending on the color of emitted light.

5. The electro-optical device according to claim 4, a width of the second wiring line disposed outside the effective region being larger than a width of part of one of the first wiring lines arranged depending on the type of the electro-optical elements, the part being disposed outside the effective region, the one being the widest of the first wiring lines.

6. The electro-optical device according to claim 1, the first substrate having a dummy region disposed between the effective region and at least one of a plurality of sides forming an outer circumference of the first substrate, and
the first wiring lines and the second wiring line being arranged between the dummy region and at least one of the plurality of sides forming the outer circumference of the first substrate.

7. The electro-optical device according to claim 6, the second electrode covering at least the effective region and the dummy region.

8. The electro-optical device according to claim 7, a connection between the second wiring line and the second electrode lying between the effective region and at least three of the plurality of sides forming the outer circumference of the first substrate.

9. The electro-optical device according to claim 1, each of the plurality of first electrodes being included in corresponding pixel electrodes arranged in the effective region, and each including a plurality of control lines to transmit signals to control the pixel electrodes, and
a plurality of the control lines being arranged such that each control line and at least one of the first wiring lines and the second wiring line do not cross on the first substrate.

10. The electro-optical device according to claim 9, the control lines each including corresponding scanning lines to transmit scanning signals to the corresponding pixel electrodes, and also each including corresponding data lines to transmit data signals to the corresponding pixel electrodes.

11. The electro-optical device according to claim 1, the electro-optical elements each including corresponding hole injection/transport layers and corresponding light-emitting layers containing an organic electroluminescent material, each hole injection/transport layer and light-emitting layer being stacked.

12. An electronic apparatus, comprising:
the electro-optical device according to claim 1.

13. A wiring substrate for electro-optical devices that each include electro-optical elements that are each disposed between a plurality of corresponding first electrodes and a second electrode acting as a common electrode for the first electrodes, the wiring substrate comprising:
- a first substrate having a first end and a second end opposite from each other, the second end being for mounting a second substrate;
- a plurality of first electrodes disposed on the first substrate;
- first wiring lines to apply power-supply voltages to the first electrodes and being for being electrically connected to a luminescent power-supply circuit of a control integrated circuit mounted on the second substrate; and
- a second wiring line connected to the second electrode;
- at least a part of the second wiring line being disposed between an effective region having the first electrodes therein and the first end of the first substrate.

14. An electro-optical device, comprising:
- a first substrate having a first end and a second end opposite from each other, the second end side being for mounting a second substrate;
- a plurality of first electrodes disposed in an effective region on the first substrate;
- a second electrode acting as a common electrode for the plurality of first electrodes;
- a plurality of electro-optical elements, each being disposed between the second electrode and a corresponding first electrode;
- first wiring lines to apply power-supply voltages to the first electrodes and being for being electrically connected to a luminescent power-supply circuit of a control integrated circuit mounted on the second substrate; and
- a second wiring line connected to the second electrode, at least a part of the second wiring line being disposed between the effective region and the first end of the first substrate.

15. A light-emitting device, comprising:
- a first electrode group region in which a plurality of first electrodes and transistors connected to each of the plurality of first electrodes are arranged on a substrate;
- a second electrode that is arranged in common with respect to the plurality of first electrodes;
- a light-emitting element that is arranged between each of the plurality of first electrodes and the second electrode;
- a driving circuit that is arranged outside of the first electrode region and supplies an electrical signal to the transistors;
- first wiring lines that supply a power-source voltage to the first electrodes via the transistors; and
- a second wiring line connected to the second electrode,
- wherein the second wiring line extends along a plurality of sides forming an outer circumference of the substrate and is provided with a portion arranged between the outer circumference of the substrate and the driving circuit.

16. The light-emitting device as set forth in claim 15,
wherein the first wiring line extends along a plurality of sides forming the outer circumference of the first substrate and is provided with a portion arranged between the second wiring line and the driving circuit.

17. The light-emitting device as set forth in claim 15,
wherein the second wiring line extends along at least three sides of the plurality of sides forming the outer circumference of the first substrate.

18. The light-emitting device as set forth in claim 15,
wherein the line width of the second wiring line is formed wider than the line width of the first wiring line.

19. The light-emitting device as set forth in claim 15,
wherein each of the plurality of light-emitting elements is arranged between corresponding first electrodes of the plurality of first electrodes and the second electrode and is provided with a light-emitting layer that emits light as a voltage is applied between the corresponding first electrodes and the second electrode;
the plurality of light-emitting elements include a plurality of types of light-emitting elements in which light-emitting colors of the light-emitting layers are different; and
the first wiring lines are wired for each light-emitting color.

20. The light-emitting device as set forth in claim 15, further comprising:
a plurality of control lines that transmit the electrical signal to the transistors,
wherein the plurality of control lines are arranged so that they do not cross at least one of the first wiring line and the second wiring line at least on the first substrate.

* * * * *